(12) United States Patent
Simmons et al.

(10) Patent No.: US 8,559,904 B2
(45) Date of Patent: Oct. 15, 2013

(54) SYSTEM AND METHOD FOR DUTY CYCLE CONTROL OF A CRYSTAL OSCILLATOR

(75) Inventors: John Simmons, Tamarac, FL (US); Kristopher Kaufman, Gilbert, AZ (US)

(73) Assignee: Intel IP Corporation, Santa Clara, CA (US)

( * ) Notice: Subject to any disclaimer, the term of this patent is extended or adjusted under 35 U.S.C. 154(b) by 395 days.

(21) Appl. No.: 12/859,601

(22) Filed: Aug. 19, 2010

(65) Prior Publication Data
US 2012/0046005 A1 Feb. 23, 2012

(51) Int. Cl.
*H04B 1/06* (2006.01)
*H04B 7/00* (2006.01)

(52) U.S. Cl.
USPC ............................ 455/257; 455/131; 331/185

(58) Field of Classification Search
USPC ................... 331/185, 73, 158, 160, 186, 109; 455/255–265, 131
See application file for complete search history.

(56) References Cited

U.S. PATENT DOCUMENTS

| | | | |
|---|---|---|---|
| 3,999,368 A | 12/1976 | Yoshida | 368/159 |
| 5,113,156 A * | 5/1992 | Mahabadi et al. | 331/109 |
| 5,719,534 A | 2/1998 | Imura | 331/186 |
| 6,445,258 B1 * | 9/2002 | Truong | 331/158 |
| 7,123,109 B2 | 10/2006 | Stevenson et al. | 331/109 |
| 7,176,765 B1 * | 2/2007 | Shorb et al. | 331/111 |
| 2010/0015992 A1 * | 1/2010 | Wakefield | 455/456.1 |

OTHER PUBLICATIONS

United States Patent Application; John Simmons et al.; U.S. Appl. No. 12/860,447; pp. 22, Aug. 20, 2010.

* cited by examiner

*Primary Examiner* — Christian Hannon
(74) *Attorney, Agent, or Firm* — Baker Botts L.L.P.

(57) ABSTRACT

In accordance with some embodiments of the present disclosure, an oscillator may include a crystal resonator and a squaring circuit coupled to the crystal resonator and configured to convert a sinusoidal signal produced by the crystal resonator to a square-wave signal, the squaring circuit comprising a bias circuit configured to transmit a selected bias voltage for the squaring circuit, the selected bias voltage selected from a plurality of potential bias voltages. In accordance with this and other embodiments of the present disclosure, an oscillator may include a crystal resonator, an inverter coupled in parallel with the crystal resonator, and a programmable voltage regulator coupled to the inverter. The programmable voltage regulator may be configured to supply a first supply voltage to the inverter during a startup duration of the oscillator, and supply a second supply voltage to the inverter after the startup duration, wherein the second supply voltage is lesser than the first supply voltage.

12 Claims, 4 Drawing Sheets

SYSTEM AND METHOD FOR DUTY CYCLE CONTROL OF A CRYSTAL OSCILLATOR

TECHNICAL FIELD

The present disclosure relates generally to wireless communication and, more particularly, to duty cycle control of oscillator circuits of wireless communication devices.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Transmitters, receivers, and transceivers often include components known as oscillators. An oscillator may serve many functions in a transmitter, receiver, and/or transceiver, including generating local oscillator signal (usually in a radio-frequency range) for upconverting baseband signals onto a radio-frequency (RF) carrier and performing modulation for transmission of signals, and/or for downconverting RF signals to baseband signals and performing demodulation of received signals.

To achieve desired functionality, such oscillators must often have designs that produce precise operating characteristics. For example, it is often critical that an oscillator output have a duty cycle that is as close to exactly 50% as possible. The duty cycle of an oscillator output may be defined as the duration in which the output is "high" (e.g., has a voltage at or proximate to its maximum operating voltage) divided by the period of the oscillator output signal (e.g., the inverse of the oscillator output frequency). Failure to maintain an exact or near-exact 50% duty cycle may cause spurious content (e.g., undesired harmonics) to appear in an oscillator or elsewhere in a receiver, transmitter, or transceiver of which it is a part.

In addition, it is often desired that once powered on, an oscillator begin operating as quickly as possible. One method to ensure fast startup is to provide a high bias voltage to one or more components of the oscillator. However, such high bias voltage may cause stress in a crystal resonator of the oscillator, which may lead to damage to the crystal resonator or undesired operation.

SUMMARY

In accordance with some embodiments of the present disclosure, an oscillator may include a crystal resonator and a squaring circuit coupled to the crystal resonator and configured to convert a sinusoidal signal produced by the crystal resonator to a square-wave signal, the squaring circuit comprising a bias circuit configured to transmit a selected bias voltage for the squaring circuit, the selected bias voltage selected from a plurality of potential bias voltages. In accordance with this and other embodiments of the present disclosure, an oscillator may include a crystal resonator, an inverter coupled in parallel with the crystal resonator, and a programmable voltage regulator coupled to the inverter. The programmable voltage regulator may be configured to supply a first supply voltage to the inverter during a startup duration of the oscillator, and supply a second supply voltage to the inverter after the startup duration, wherein the second supply voltage is lesser than the first supply voltage. Technical advantages of one or more embodiments of the present disclosure may include a bias voltage for a crystal oscillator may be tunable, thus allowing for selection of a bias voltage that minimizes harmonic and spurious effects in a wireless communication element. Other technical advantages may include for a variable oscillator supply voltage wherein a large initial supply voltage is supplied to allow for fast startup of the oscillator, and such supply voltage is decreased to a lower voltage to meet crystal stress specifications for a crystal resonator of the oscillator.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
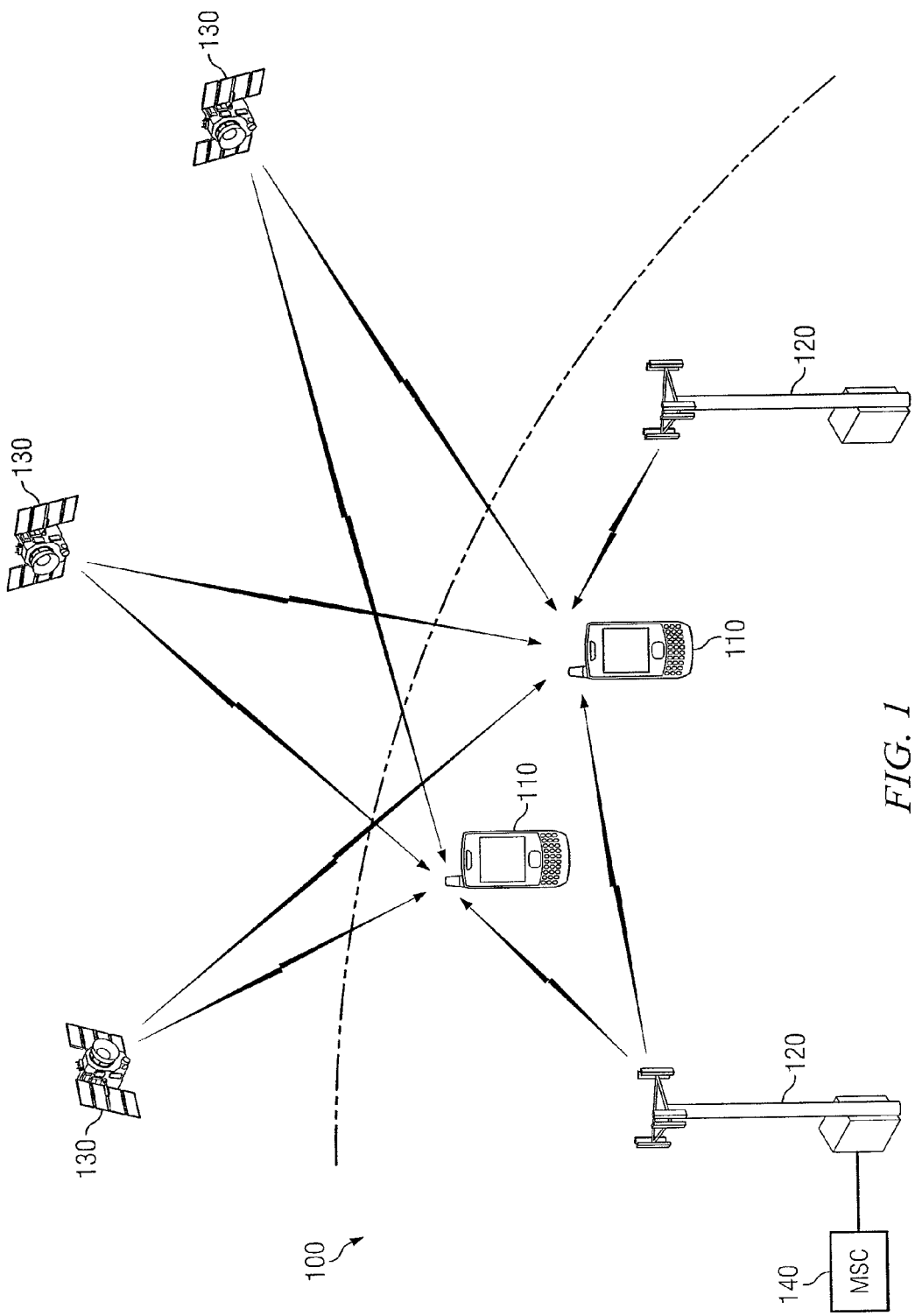
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
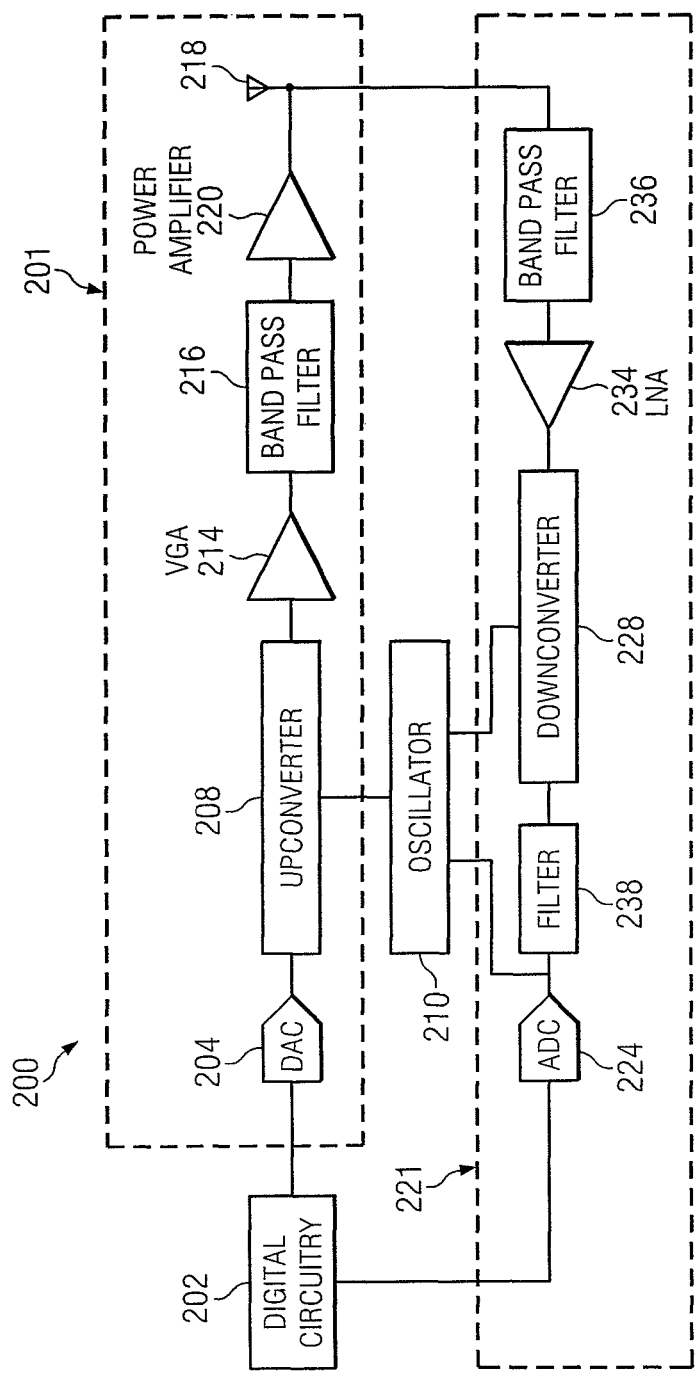
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator. Oscillator 210 may be described in greater detail below with reference to FIG. 3.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifiers (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

Figure 3:
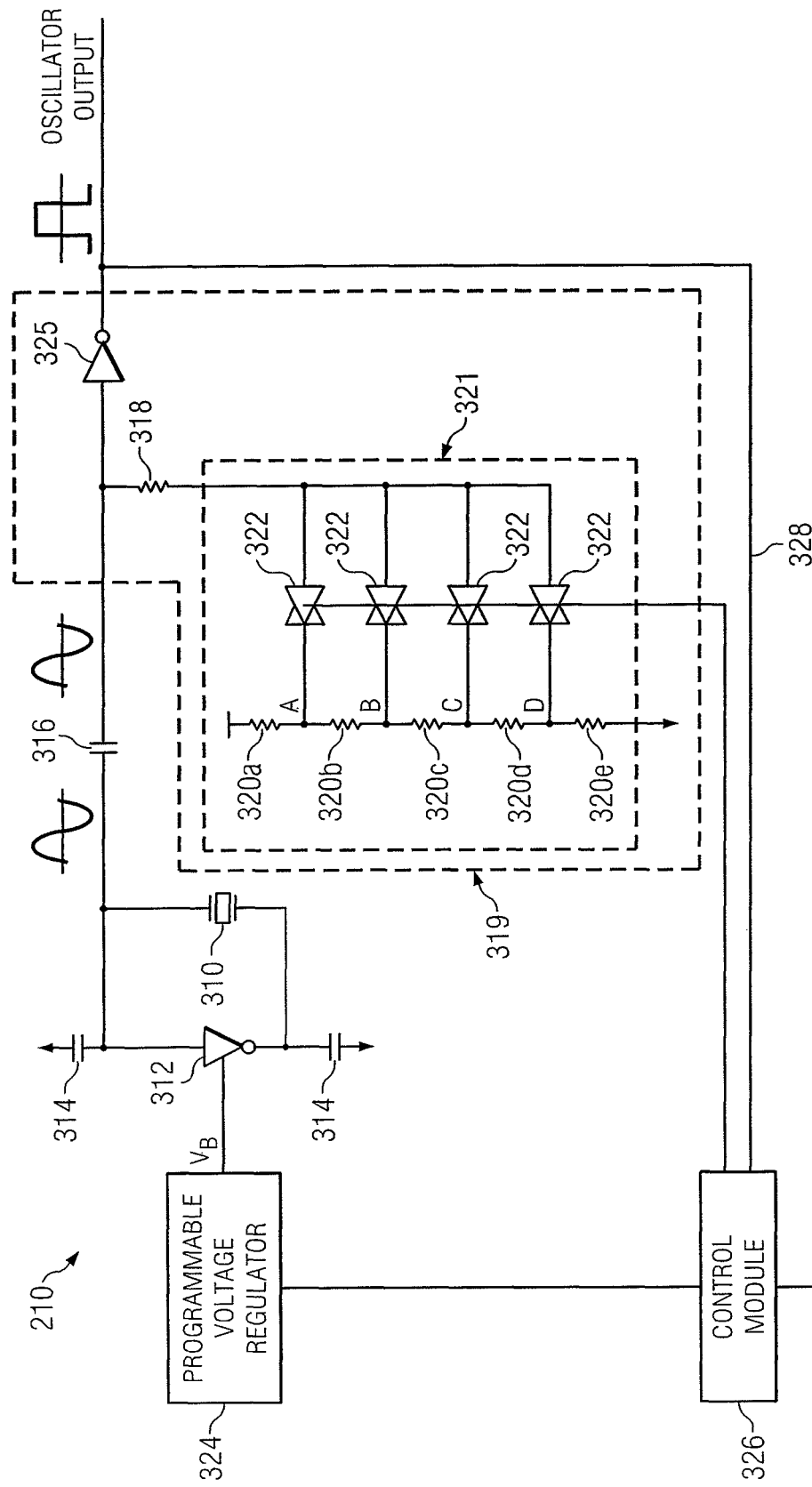
FIG. 3 illustrates a block diagram of an example oscillator, in accordance with certain embodiments of the present disclosure.

FIG. 3 illustrates a block diagram of certain embodiments of oscillator 210, in accordance with certain embodiments of the present disclosure. As shown in FIG. 3, oscillator 210 may include a resonator 310 in parallel with an inverter 312. Resonator 310 may include any piezoelectric material (e.g., a quartz crystal) with a mechanical resonance that may, in conjunction with other components of oscillator 300, create an electrical signal with a highly-precise frequency.

Inverter 312 may include any system, device or apparatus configured to invert a digital signal driven on its input. For example, if inverter 312 receives a low voltage (e.g., logic 0) driven on its input, it may drive a high voltage (e.g., logic 1) on its output. Alternatively, if inverter 312 receives a high voltage (e.g., logic 1) driven on its input, it may drive a low voltage (e.g., logic 0) on its output. Inverter 312 may be implemented as a PMOS inverter, NMOS inverter, static CMOS inverter, saturated-load digital inverter, or any other suitable implementation. However, during operation, inverter 312 may be biased in its linear region, thus allowing it to operate as a high gain inverting amplifier.

Each terminal of crystal resonator 310 may also be coupled to one or more capacitors 314. Although each terminal of crystal resonator 310 is depicted as being coupled to one capacitor 314, in some embodiments each terminal of crystal resonator 310 may be coupled to a "capacitor bank" of two or more capacitors. In such embodiments, all or a portion of such capacitors may be switched capacitors, therein allowing tuning of the effective capacitance of each capacitor bank and ultimately, tuning of the output frequency of oscillator 210. In many instances, any such capacitor banks of oscillator 210 may be substantially identical.

As shown in FIG. 3, oscillator 210 may also include a squaring circuit 319. Squaring circuit 319 may be coupled to crystal resonator 310 via DC blocking capacitor 316. DC blocking capacitor 316 may be configured to block direct current of the direct current bias provided by squaring circuit 319 while allowing alternating current of oscillator 210 to pass.

As depicted, squaring circuit 319 may include a bias circuit 321, a resistor 318, and an inverter 325. Bias circuit 321 may include a plurality of resistors 320 (e.g., resistors 320a-320e) that may form a voltage divider. The resistances of the resistors 320 may be selected such that desired voltages appear on each node of the voltage divider (e.g., nodes A, B, C, and D). To illustrate, resistances of resistors 320 may be selected such that an approximate desired bias voltage appears at one of the nodes of the voltage divider, while the other nodes have different voltages that are proximate to, but different from, the approximate desired bias voltage, thus providing a range of voltages near the approximate desired bias voltage. Bias circuit 321 may also include a plurality of transmission gates 322. Transmission gates 322 may be configured such that no more than one transmission gate 322 is enabled at a given time, thus allowing the voltage present at one of the nodes of the voltage divider to pass through such transmission gate 322. Transmission gates 322 may be coupled to control module 326, thus allowing selective enabling and disabling of transmission gates 322.

Inverter 325 may include any system, device or apparatus configured to invert a digital signal driven on its input. For example, if inverter 325 receives a low voltage (e.g., logic 0) driven on its input, it may drive a high voltage (e.g., logic 1) on its output. Alternatively, if inverter 325 receives a high voltage (e.g., logic 1) driven on its input, it may drive a low voltage (e.g., logic 0) on its output. Inverter 325 may be implemented as a PMOS inverter, NMOS inverter, static CMOS inverter, saturated-load digital inverter, or any other suitable implementation. However, during operation, inverter 325 may be configured to convert a sinusoidal signal produced by resonator 310 to a square-wave signal. In some embodiments, the gate of inverter 325 may be considered the output of squaring circuit 321. In operation, bias circuit 321, in connection with control module 326 may provide for selection of a DC bias voltage for squaring circuit 319, and thus also selecting a DC bias voltage for oscillator 210.

Resistor 318 may be configured to provide a high-impendance point for the oscillator input signal while providing a DC bias point for squaring circuit 319.

Figure 4:
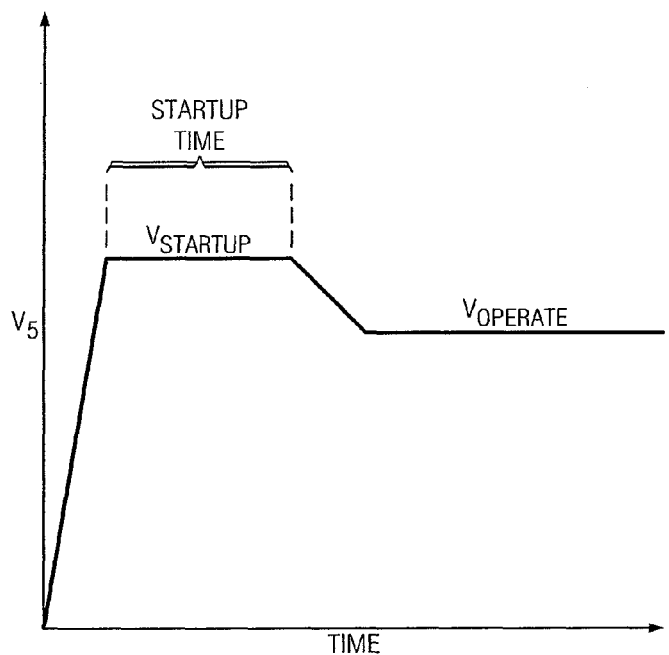
FIG. 4 illustrates graph of an example waveform over time for a bias voltage of the oscillator depicted in FIG. 3, in accordance with certain embodiments of the present disclosure.

As shown in FIG. 3, oscillator 210 may also include programmable voltage regulator 324. Programmable voltage regulator 324 may be coupled to inverter 312 and control module 326 and may include any system, device, or apparatus configured to automatically maintain a substantially constant supply voltage level for inverter 312, wherein such supply voltage is based on a control signal communicated to programmable voltage regulator 324 from control module 326. Operation of programmable voltage regulator 324 may be understood by reference to FIG. 4. As shown in FIG. 4, upon startup (e.g., powering on) of oscillator 210, control module 326 may communicate control data to programmable voltage regulator 324 such that programmable voltage regulator 324 ramps its initial output voltage (e.g., $v_s$) to a voltage $V_{startup}$. After a startup time, oscillator 210 may become operational (e.g., oscillator 210 may operate at its desired oscillation frequency), and as a result, control module 326 may communicate control data to programmable voltage regulator 324 such that programmable voltage regulator 324 decreases its output voltage (e.g., $v_s$) to a voltage $V_{operate}$. In certain embodiments, the voltage $V_{operate}$ may be selected based on specifications (e.g., manufacturer specifications) for crystal stress of resonator 310. In these and other embodiments, control module 326 may detect that oscillator 210 is operational by sensing the output of oscillator 210 (e.g., via path 328) or another characteristic of oscillator 210. As a result of a higher supply voltage $V_{startup}$ during startup, oscillator 210 may reach its oscillation frequency faster than if the lower supply voltage $V_{operate}$ were constant during and after the startup time. In addition, decrease of the supply voltage to a lower operational supply voltage $V_{operate}$ after the startup time may decrease stress on crystal resonator 310 that may be present if oscillator 210 were operated with a supply voltage greater than $V_{operate}$.

Control module 326 may be coupled to the output of oscillator 210 (e.g., via path 328), transmission gates 322 of squaring circuit 319, programmable voltage regulator 324, and/or receive path 221 of element 200, and may be any system, device, or apparatus configured to communicate control signals to selectively enable and disable transmission gates 322 and/or to control the supply voltage output by programmable voltage regulator 324. Control module 326 may also have additional functionality, as illustrated by FIG. 5.

Figure 5:
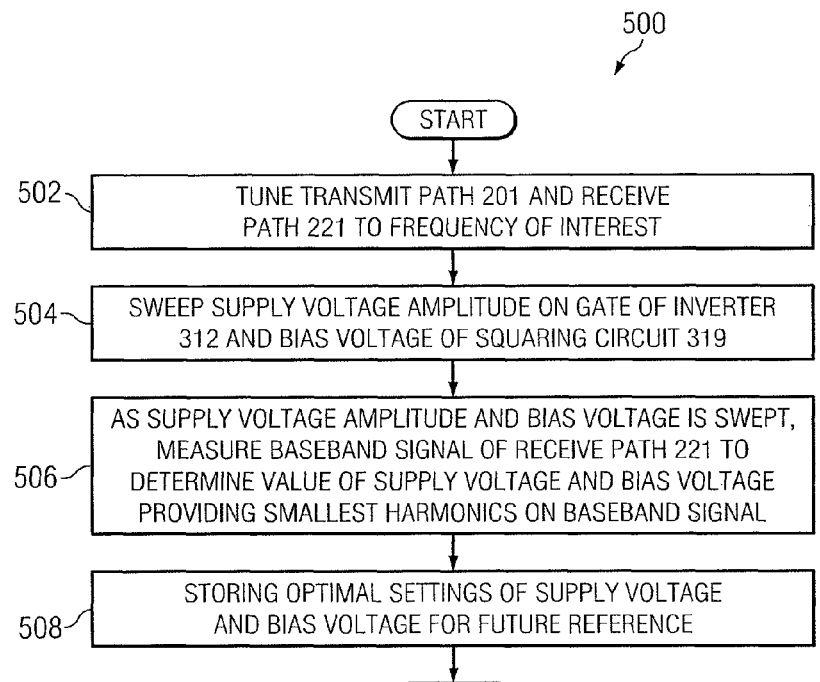
FIG. 5 illustrates a flow chart of an example method for calibrating an oscillator, in accordance with certain embodiments of the present disclosure.

FIG. 5 illustrates a flow chart of an example method 500 for calibrating oscillator 210, in accordance with certain embodiments of the present disclosure. According to one embodiment, method 500 may begin at step 502. As noted above, teachings of the present disclosure may be implemented in a variety of configurations of system 100. As such, the initialization point for method 500 and the order of the steps 502-508 comprising method 500 may depend on the implementation chosen.

At step 502, transmit path 201 and receive path 221 may be tuned to a frequency of interest (e.g., oscillator 210 may be tuned to a frequency for a particular communication channel of interest). For example, although not depicted in FIG. 3, control module 326 and/or another component of element 200 may be configured to selectively enable or disable capacitors of capacitor banks coupled to the terminals of resonator 310 in order to tune oscillator 210 to the frequency of interest.

At step 504, control module 326 may communicate control data that may sweep the supply voltage amplitude and bias voltage of squaring circuit 319. At step 506, control module 326 and/or another component of element 200 may be configured to measure a baseband signal of receive path 221 (e.g., a signal output by filter 238) in order to determine harmonics present in the signal and the amplitude levels of such harmonics as the supply voltage amplitude and bias voltage amplitude are varied. For example, as shown in FIGS. 2 and 3, control module 326 may be coupled to the output of filter 238 of receive path 221 in order to measure the baseband signal present thereon. As a result of steps 504 and 506, values of supply voltage amplitude and bias voltage providing minimal harmonics on the baseband signal of receiver path 221 may be determined. For example, to determine an optimal supply voltage amplitude, control module 326 may iteratively communicate control data to programmable voltage regulator 324 to sweep the supply voltage across a range of supply voltages, and then determine which supply voltage amplitude provides minimal harmonics on the receiver path 221 baseband signal. As another example, to determine an optimal bias voltage, control module 326 may iteratively communicate control data to transmission gates 322 in order to iteratively enable transmission gates 322 to sweep the bias voltage across of a range of bias voltages provided by the voltage divider of squaring circuit 319, and then determine which bias voltage provides minimal harmonics on the receiver path 221 baseband signal. In some embodiments, the bias voltage providing minimal harmonics on the receiver path 221 baseband signal may be a bias voltage that produces an duty cycle of approximately 50% on the output of oscillator 210. In other embodiments, a duty cycle other than 50% may be desirable.

In certain embodiments, transmit path 201 and receiver path 221 may be configured such that a signal produced by transmit path 201 may be looped back to receiver path 221 in order to determine the presence and amplitude of the harmonics on the receiver path 221 baseband signal. In such embodiments, the loopback path may require a translational mixer (not shown) to offset the transmit path 201 frequency from the receive path 221 frequency to prevent voltage-controlled oscillator pulling (e.g. one voltage-controlled oscillator interfering with another).

At step 508, control module 326 may store the detected optimal settings for supply voltage and bias voltage (or store other variables indicative of such supply voltage and bias voltage, such as the control data associated with such supply voltage or bias voltage, for example). Notably, an optimal setting for supply voltage and bias voltage may be stored for a number of different frequencies of interest. Such settings may then be later used by control module 326 in order to communicate appropriate control data to programmable voltage regulator 324 and/or transmission gates 322 in order to produce the optimal supply voltage and/or bias voltage. After completion of step 508, method 500 may end.

Although FIG. 5 discloses a particular number of steps to be taken with respect to method 500, method 500 may be executed with greater or lesser steps than those depicted in FIG. 5. In addition, although FIG. 5 discloses a certain order of steps to be taken with respect to method 500, the steps comprising method 500 may be completed in any suitable order.

Method 500 may be implemented using control module 326, any component of system 100, and/or any other system operable to implement method 500. In certain embodiments, method 500 may be implemented partially or fully in software and/or firmware embodied in computer-readable media.

Modifications, additions, or omissions may be made to system 100 from the scope of the disclosure. The components of system 100 may be integrated or separated. Moreover, the operations of system 100 may be performed by more, fewer, or other components. As used in this document, "each" refers to each member of a set or each member of a subset of a set.

Although the present, disclosure has been described with several embodiments, various changes and modifications may be suggested to one skilled in the art. It is intended that the present disclosure encompass such changes and modifications as fall within the scope of the appended claims.

What is claimed is:

1. A wireless communication element, comprising:
    a receive path configured to receive a first wireless communication signal and convert the first wireless communication signal into a first digital signal based at least on an oscillator signal; and
    a transmit path configured to convert a second digital signal into a second wireless communication signal based at least on the oscillator signal and transmit the second wireless communication signal; and
    an oscillator configured to output the oscillator signal to at least one of the receive path and the transmit path, the oscillator comprising:
        a crystal resonator;
        a squaring circuit coupled to the crystal resonator and configured to convert a sinusoidal signal produced by the crystal resonator to a square-wave signal, the squaring circuit comprising a bias circuit configured to transmit a selected bias voltage for the squaring circuit, the selected bias voltage selected from a plurality of potential bias voltages; and
        a control module coupled to the bias circuit and configured to select the selected bias voltage from the plurality of potential bias voltages, the control module further configured to:
            iteratively select each of the plurality of potential bias voltages for transmission by the bias circuit to the gate of the inverter;
            measure harmonics produced in the wireless communication element for each of the plurality of potential bias voltages; and
            select, as the selected bias voltage, the potential bias voltage for which harmonics produced in the wireless communication element are the smallest.

2. A wireless communication element according to claim 1, wherein the selected bias voltage is the potential bias voltage that produces the smallest harmonics in the wireless communication element.

3. A wireless communication element according to claim 1, the squaring circuit comprising:
    an inverter configured to convert the sinusoidal signal to the square-wave signal; and
    a bias circuit coupled to a gate of the inverter and configured to transmit the selected bias voltage to the gate from the plurality of potential bias voltages.

4. A wireless communication element according to claim 3, the bias circuit comprising:
    a voltage divider having a plurality of nodes, each node carrying one of the plurality of potential bias voltages; and
    a plurality of transmission gates, each transmission gate associated with one of the plurality of nodes, the plurality of transmission gates configured such that only one of the potential bias voltages is transmitted through the transmission gates.

5. A wireless communication element according to claim 4, the voltage divider comprising a plurality of series resistances.

6. An oscillator, comprising:
    a crystal resonator;
    a squaring circuit coupled to the crystal resonator and configured to convert a sinusoidal signal produced by the crystal resonator to a square-wave signal, the squaring circuit comprising a bias circuit configured to transmit a selected bias voltage for the squaring circuit, the selected bias voltage selected from a plurality of potential bias voltages; and
    a control module coupled to the bias circuit and configured to select the selected bias voltage from the plurality of potential bias voltages, the control module further configured to:
        iteratively select each of the plurality of potential bias voltages for transmission by the bias circuit to the gate of the inverter;
        measure harmonics produced in the wireless communication element for each of the plurality of potential bias voltages; and
        select, as the selected bias voltage, the potential bias voltage for which harmonics produced in the wireless communication element are the smallest.

7. An oscillator according to claim 6, wherein the selected bias voltage is the potential bias voltage that produces the smallest harmonics in a circuit coupled to the oscillator.

8. An oscillator according to claim 6, the squaring circuit comprising:
    an inverter configured to convert the sinusoidal signal to the square-wave signal; and a bias circuit coupled to a gate of the inverter and configured to transmit the selected bias voltage to the gate from the plurality of potential bias voltages.

9. An oscillator according to claim 8, the bias circuit comprising:
- a voltage divider having a plurality of nodes, each node carrying one of the plurality of potential bias voltages; and
- a plurality of transmission gates, each transmission gate associated with one of the plurality of nodes, the plurality of transmission gates configured such that only one of the potential bias voltages is transmitted through the transmission gates.

10. An oscillator according to claim 9, the voltage divider comprising a plurality of series resistances.

11. A method, comprising:
- tuning a transmit path and a receive path of a wireless communication element to a frequency of interest;
- varying a bias voltage for a squaring circuit of an oscillator of the wireless communication element among a plurality of potential bias voltages;
- measuring harmonics produced in a baseband signal of the wireless communication element for each of the plurality of potential bias voltages, wherein measuring harmonics produced in the wireless communication element comprising measuring harmonics present on a baseband signal of the receive path for each of the plurality of potential bias voltages; and
- operating the wireless communication element at the potential bias voltage for which harmonics produced in the baseband signal of the wireless communication element are the smallest.

12. A method according to claim 11, further comprising storing information regarding the potential bias voltage for which harmonics produced in the wireless communication element are the smallest.

\* \* \* \* \*